United States Patent
Potter

(10) Patent No.: US 7,358,106 B2
(45) Date of Patent: Apr. 15, 2008

(54) HERMETIC MEMS PACKAGE AND METHOD OF MANUFACTURE

(75) Inventor: Curtis Nathan Potter, Austin, TX (US)

(73) Assignee: Stellar Micro Devices, Austin, TX (US)

( * ) Notice: Subject to any disclaimer, the term of this patent is extended or adjusted under 35 U.S.C. 154(b) by 288 days.

(21) Appl. No.: 11/071,038

(22) Filed: Mar. 3, 2005

(65) Prior Publication Data

US 2006/0197215 A1   Sep. 7, 2006

(51) Int. Cl.
    *H01L 21/00* (2006.01)
(52) U.S. Cl. .................. 438/51; 438/106; 257/727; 257/732; 257/710; 257/E21.519
(58) Field of Classification Search .................. 438/51, 438/106; 257/E21.519, 727, 732, 710
    See application file for complete search history.

(56) References Cited

U.S. PATENT DOCUMENTS

| 3,735,211 | A  | * | 5/1973  | Kapnias ............... 257/729 |
| RE34,291  | E  | * | 6/1993  | Liguori et al. ............ 361/784 |
| 5,477,081 | A  | * | 12/1995 | Nagayoshi ................ 257/678 |
| 6,483,030 | B1 | * | 11/2002 | Glenn et al. .............. 174/521 |
| 6,667,544 | B1 | * | 12/2003 | Glenn ..................... 257/686 |
| 7,129,576 | B2 | * | 10/2006 | Humpston ................ 257/704 |
| 2004/0067604 | A1 | * | 4/2004 | Ouellet et al. ............ 438/108 |

* cited by examiner

*Primary Examiner*—B. William Baumeister
*Assistant Examiner*—Steven J. Fulk

(57) ABSTRACT

A swage hermetic sealing of a MEMS or microdevice or nanodevice package using high force. A cutting and flowing edge 430 is formed on a package cover which is pressed into a mating, integral gasket 425 on a package base. A material extension of the package cover 450 is simultaneously folded under the package base to supply force maintenance for permanent hermaticity. The swage hermetic sealing of single or an array of covers to an extended wafer or substrate is accomplished by a cutting and flowing edge 560. Permanent force maintenance is achieved through a re-entrant cavity 565 and annular ring 535 on the wafer or substrate.

7 Claims, 6 Drawing Sheets

HERMETIC MEMS PACKAGE AND METHOD OF MANUFACTURE

CROSS REFERENCE TO RELATED APPLICATION

This application claims benefit of U.S. Provisional Patent application Ser. No. 60/550,844 filed Mar. 8, 2004 and Disclosure Document No. 542148, filed Nov. 17, 2003. Subject matter set forth in Provisional Patent No. 60/550,844 and Disclosure Document No. 542148 is hereby incorporated by reference into the present application as if fully set forth herein.

STATEMENT REGARDING FEDERALLY FUNDED REASERCH AND DEVELOPMENT

None

BACKGROUND OF THE INVENTION

Hermetic microdevice packages enjoy wide use in the semiconductor industry in applications where true hermeticity is required. Such hermeticity is required where any outside of the package ambient conditions or variations in the ambient conditions might affect device performance. Generally in the semiconductor industry hermetic passivation layers have been developed and applied to the surface of sensitive devices in order to give a primary level of defense against ambient conditions. Some of these layers are adequately hermetic. In other instances a hermetic package is required. Such hermetic packages are in common use for the sealing of semiconductor devices and other microdevices including the aformentioned MicroElectroMechanical (MEMS) devices.

Such hermetic packages consist of a package base commonly with electrical feedthrus insulated from such base for the purpose of extracting electrical signals from the active device inside the package. The sensitive active device is mounted on the package base and microwire bonds are made to connect the device output pads to the package base electrical feedthrus. Finally a cover or cap is attached to the base via a hermetic bonding technique which varies according the package material and its preparation. For convenience and high thruput all bonding techniques require some degree of heat application to insure a hermetic bond of cap to base. The bonding is required to be executed in the rarified atmosphere or vacuum that is required in the package after bonding.

The two most common cap to base bonding techniques utilized historically, and currently, involve cap welding or solder sealing. Cap welding is accomplished by passing a high weld current through a tip (often a small roller) which precesses around the rim of the cap/package assembly as it locally melts two metal members together. The solder sealing technique utilizes a solder preform (commonly gold/tin eutectic solder) placed between a gold plated cap and base followed by the application of a heated ring at nominally 320° C. to melt the solder and effect the hermetic seal. Both of these techniques result in a considerable amount of heat transmitted through the package base and into the active device. Although there are methods of reducing the amount of heat transfer to the active device it is not possible to eliminate the device heating altogether.

In addition to the active device heating described above heat generated at the sealing surfaces releases contaminants to the inside of the package which can affect the performance of unpassivated devices. This can be especially destructive to unpassivated MEMS devices where micro mechanical moving parts are fully exposed to released contaminants due to the sealing heat cycle.

MicroElectroMechanical devices which exhibit free standing micro mechanical structures have been hermetically packaged using both cap welding and solder sealing technology. However due to residual stress in free standing members and the extreme sensitivity of structure surfaces to contamination more complex MEMS devices cannot tolerate heat during the packaging operation. For such devices a room temperature package sealing process would be of great benefit. Room temperature hermetic sealing has been utilized in Ultra High Vacuum (UHV) technology for a number of years and is pervasive in the art of that technology.

U.S. Pat. No. 3,208,758, Carlson and Wheeler, describes a vacuum seal technique suitable for high temperature baking after a room temperature seal has been implemented. The patent is focused on large flanges used in UHV vacuum system assembly. A copper gasket seal is described wherein two mating vacuum parts structured with vertical and sloping cutting edges are swaged into the copper gasket to effect a vacuum seal. The high force required for the deformation of the copper is achieved by tightening a series of bolts and nuts around the periphery of a flange. A preferred shape of the cutting edge is disclosed although the force required to effect a vacuum tight seal is not disclosed. The assembly including the copper gasket and cutting edge shape has come to be known as a "conflat" type vacuum fitting and is in wide use in the vacuum equipment industry. It has not been applied to microdevice packaging.

Additional embodiments of the basic "conflat" sealing technique can be found in U.S. Pat. No. 3,217,992, Glasgow, and in U.S. Pat. No. 3,368,818, Asamaki, et. al. both describing alternative bolting attachment geometries to effect the metal seal. Neither patents address the possibility of applying the technique to seal MEMS or microdevice packages.

With recent rapid advances in MEMS technology leading to more sophisticated devices there has evolved a concerted effort to develop suitable packaging technology. The focus has been on both single MEMS die packaging and packaging at the wafer level. MEMS devices packaged at the wafer level is particularly attractive due to the unique fabrication technology involved. Virtually all MEMS devices end up as micro mechanical elements suspended in space. Thus during the fabrication process they must be supported by a sacrificial material usually through several levels of processing until the end of the fabrication sequence. At the end of the process the sacrificial material is removed leaving the micro mechanical members preserved in their design space. Clearly it is desirable from a cost point of view to remove (called release) the temporary support on a whole wafer rather than individual tiny die. However once release is performed the MEMS devices cannot be singulated without the individual mechanical parts being damaged or becoming stuck together (called stiction). The solution then to performing release at the wafer scale is to also package hermetically at the wafer scale prior to die singulation.

Recent development work in MEMS packaging at the wafer scale has focused on bonding directly to the silicon substrate that was used as the MEMS substrate. This includes anodic/fusion bonding using high electric fields, eutectic bonding using heating to form a eutectic bond between gold or aluminum to silicon and thermocompression bonding. The novel application of heat has been explored by using a polysilicon resistance heater element embedded directly into the MEMS devices. Such recent work has not included attempts to use the compression swaging technique disclosed herein.

U.S. Pat. No. 6,379,988 B1, Petersen and Conley describe a pre release plastic packaging of MEMS devices wherein the device is encapsulated in a plastic package prior to release. The plastic package can be perforated to allow release in the package using wet or dry etching processes. In a final step a cover lid is attached to the plastic package by various means common in prior art.

U.S. Pat. No. 6,400,009 B1, Bishop, et. al., discloses a MEMS package and bonding means employing a firewall to form a protective cavity for the MEMS device during heat sealing of top and bottom members of the package. Electrical feedthrus that penetrate the firewall are disclosed and may be made of polysilicon conductive material encapsulated with silicon dioxide. All structures disclosed are fabricated concurrently with the MEMS device. An integral plurality of solder bumps is utilized and claimed as a means of strengthening the solder bonded parts. The sealing means described is by heated solder sealing.

U.S. Pat. No. 6,627,814B1, David H. Stark, discloses a package with a continuous sidewall with a top surface prepared for solder sealing. A transparent window forms a top cover. The window is prepared with an outer metallic frame suitable for soldering to the base. The solder method requires the application of heat above the melting temperature of the solder.

U.S. Pat. No. 6,639,313 B1, Martin and Hamey, discloses a ceramic package with a recess for holding an optical MEMS mirror device. A glass window cover is disclosed which is heat solder sealed to the ceramic substrate by means of a flexible, folded metal interposer disposed peripherally around the edge of the glass window and ceramic base. Uniquely the folded metal interposer allows the difference in expansion and contraction between the window and the ceramic to be mitigated during heat cycling. Hermeticity is achieved by heat soldering.

OBJECTS AND ADVANTAGES OF THE INVENTION

The object of the invention is to adapt the high vacuum compression seal technology first disclosed in U.S. Pat. No. 3,208,758 , to the hermetic sealing of singulated and released MEMS and other microdevices.

Another object of the invention is to disclose a device consisting of a vacuum seal structure and a force maintenence structure that will achieve a high degree of hermeticity.

A further object of the invention is to form a seal ring of copper or other suitable material such as indium or gold for example on one member of a package cap or base assembly by means of plating or cladding. Such seal ring will form the gasket material suitable for a hermetic seal.

Another object of the invention is to form a cutting and swaging structure on one or both package base and cap for the purpose of cutting and flowing the seal ring material.

Another object of the invention is to form a structure on either package cap or base that will, after compression sealing maintain the force required to keep the package and base under compression.

A further object and advantage of the invention is to form such gasket, cutting and flowing edge and locking mechanism on a substrate at the wafer scale thus enabling the basic bonding technology to be extended to wafer scale hermetic packaging.

Another object and advantage of the invention is to form a hermetic seal at room temperature with such seal exhibiting a leak rate of less than $10^{-9}$ Torr liter/sec.

A specific advantage of the invention is a method of room temperature hermetic sealing of MEMS devices that exhibit sensitivity to heat cycling during the sealing operation.

Another advantage of the invention is very high thruput sealing since only a single compression step is required for making a hermetic seal. No heat cycling with attendant solder melt or welding dwell times is required.

Another advantage of the invention is its application to microdevices other than MEMS such as hybrid assemblies and semiconductor devices for example where they may require a high degree of hermeticity.

BRIEF SUMMARY OF THE INVENTION

An invention is disclosed which utilizes a copper gasket and cutting edge swaging technology to form a hermetic MEMS or microdevice package. In the single die packaging embodiment conventional semiconductor packages are modified or new packages are developed to provide a cutting edge structure on one or both of the cap and base. An integral, plated or separate metal gasket is provided to implement the hermetic seal. A metal forming structure is provided for maintaining force on the cap and base assembly after hermetic compression. The metal forming structure is actuated simultaneously with compression bonding through the use of a compound bonding head die.

The invention is extended to wafer scale packaging of MEMS and other microdevices through the fabrication of suitable structures for cap attachment and retaining structures during the fabrication sequence for the MEMS or microdevices. Packaging structures may be fabricated by plating or etching into the substrate at various stages during device fabrication.

DETAILED DESCRIPTION OF THE INVENTION

Although the following detailed description delineates many specific attributes of the invention and describes specific fabrication procedures those skilled in the art of microfabrication will realize that many variations and alterations in the fabrication details and the basic structures are possible without departing from the generality of the processes and structures. The most general attributes of the invention relate to a structure and method of making a hermetic seal between a package base and cap at room temperature.

Figure 1:
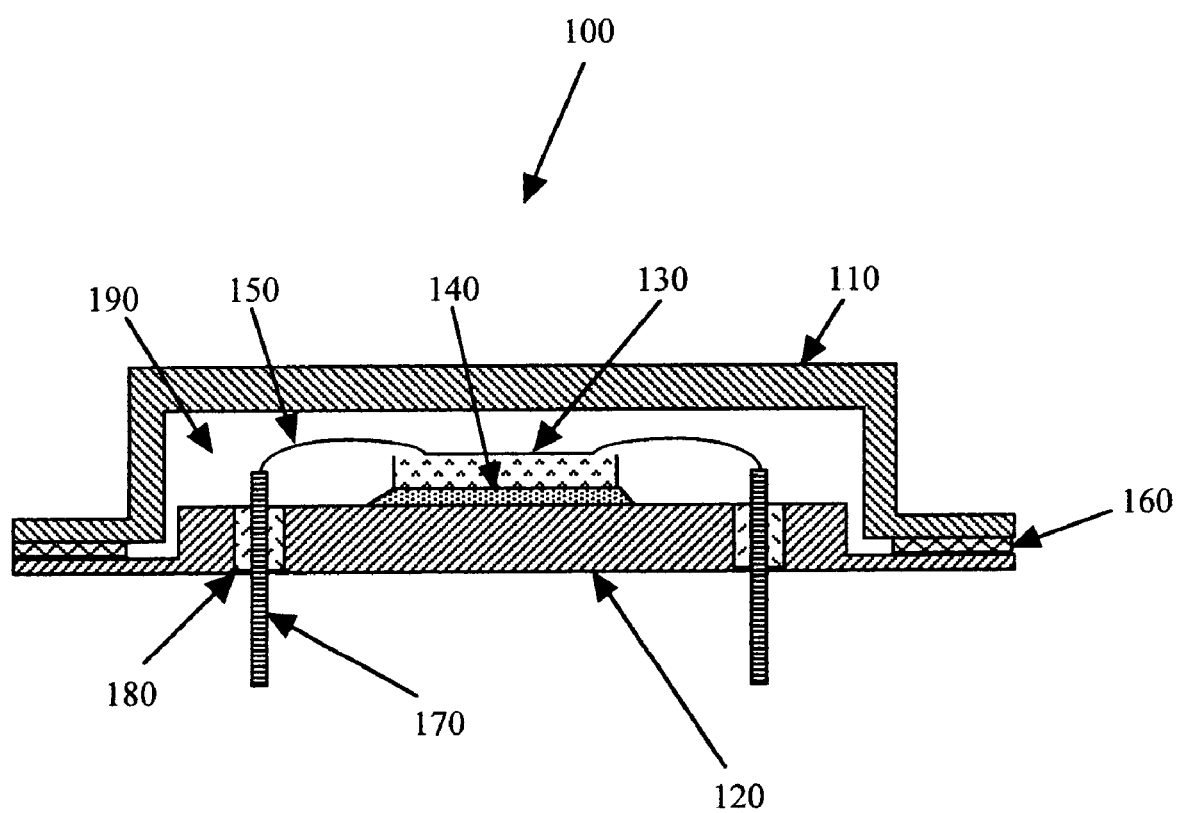
FIG. 1 shows a prior art sealing technology for attaching a package cap to a base.
Figure 2:
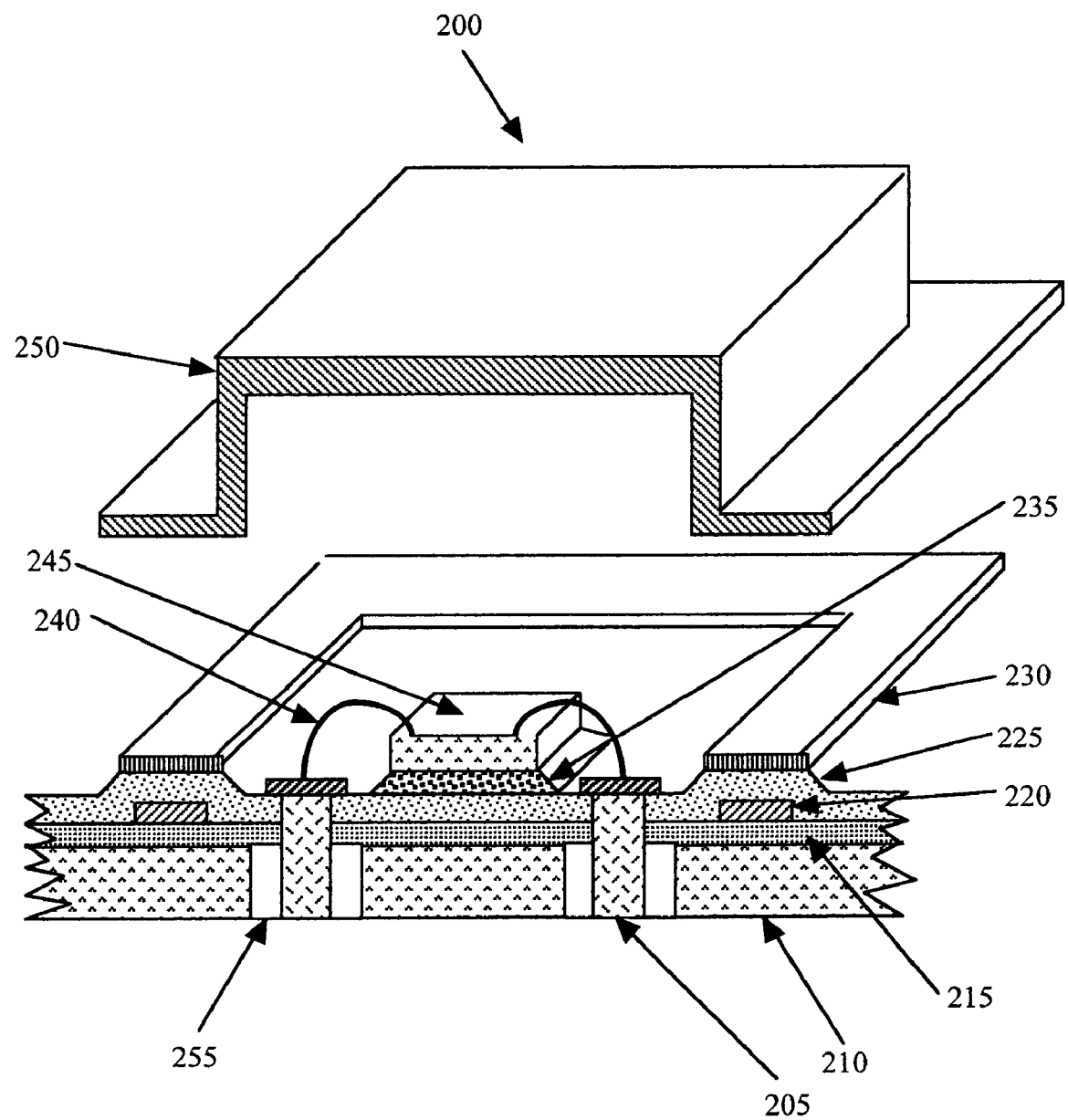
FIG. 2 shows a prior art wafer scale packaging technology utilizing an integral localized heater for performing an individual cap attachment sequentially at each die site on a wafer.
Figure 3:
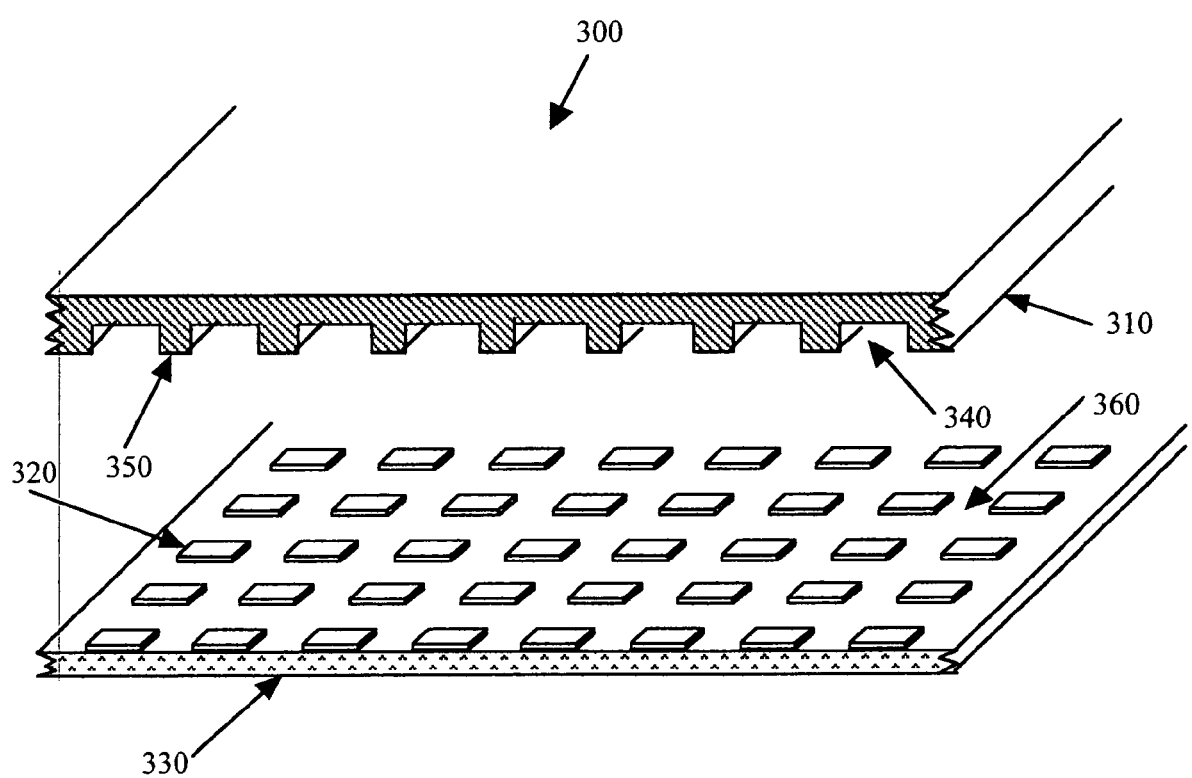
FIG. 3 shows a prior art wafer scale packaging technology where an entire wafer is capped and sealed at once using anodic, fusion or eutectic bonding.

Extensive prior art in the packaging of microdevices is shown in FIGS. 1, 2 and 3. FIG. 1 delineates a hypothetical MEMS device 130 mounted on package base 120 with electrical feedthrus 170 penetrating the base and insulated from the base by insulator 180. MEMS device 130 is attached to the base 120 using material 140 which may typically be solder or organic adhesive. Wire bonds 150 connect the MEMS device electrically to feedthrus 170. MEMS die 130 may be released from its temporary support either as a singulated die before mounting on the package base or after mounting on the base. The MEMS device may also be tested after mounting on the base in an appropriate environment of rarified gas or in vacuum. Package cap 110 is conventionally attached using heat soldering with solder preform 160 or can be weld sealed directly cap to base without solder. The package base and cap will typically be metal (often kovar) and be plated with a solderable metal in the case of solder sealing. After sealing the space 190 is hermetic and the atmosphere during sealing is trapped therein and thus constitutes the operational ambient during the life of the device. There are a number of variations on this single package assembly relating to the method of MEMS die attach, confuguration of the electrical feedthrus in the base and package profile variation as a function of how the package is attached at the PC board level. All variations are well documented in prior art.

FIG. 2 represent a different prior art approach to MEMS packaging in that caps are applied to the MEMS devices prior to die singulation. The substantial advantage is that MEMS release can be performed on a whole substrate at once rather than one die at a time. The MEMS chips are protected by the cap during singulation that often includes a wet sawing step. Thus referring to FIG. 2 substrate 210 represent a portion of a large substrate containing many die. The substrate may include electrical feedthrus 205 with filled, electrically conductive, thru vias with wire bond connections 240 directly connected to the vias. Electrically conductive vias may be insulated from an electrically conductive substrate by peripheral insulator 255 when required. MEMS device 245 is mounted upon base 210 using material 235. In this concept a polysilicon heater (or other conductor material) 220 is deposited in an annular ring around the periphery of the die site (but inside the scribe lines). If the substrate is conductive the heater ring is insulated from the base by insulator 215 and insulated from the cap 250 (if required) by insulator 225. A top solder ring 230 is provided in registration with the heater ring and will form a seal between the metal on the cap and the metal layer (not shown) on the base under the solder. Current is supplied to the resistance heater element 230 from off the substrate through peripheral leads. Thus a solder seal can be executed by localized heating close to the solder location which minimizes the heat flux in the vicinity of the die.

Another prior art wafer scale packaging technique is shown in FIG. 3. An array of MEMS die 320 can be released from the temporary support at the wafer scale. A portion of a larger array of MEMS die is shown on substrate 330. The die are separated by wide scribe lines 360. An entire matching substrate, a portion of which is shown in FIG. 3, 310 can be bonded by pressure and electric field application (called anodic or fusion bonding). Cavities 340 formed in the extended cap substrate provide space for the MEMS devices after bonding. However for the process to function at a high level of yield the matching substrates must be very flat for intimate contact everywhere and the cap and base material system must be amenable to such a process. Silicon substrates are commonly used with silicon caps. After wafer scale bonding the die can be singulated by sawing without damage to the active MEMS devices. A variety of prior art sealing techniques are used and described in the literature. Among them covalent bonding requires near perfect atomic flatness of the two mating surfaces but can be accomplished at room temperature. Anodic and Fusion bonding requires extremely flat mating surfaces along with high electric fields and varying degrees of heat. Eutectic bonding is accomplished at elevated temperatures where the two members form a eutectic bond such as between silicon and gold. Solder bonding makes use of elevated temperatures to melt a solder alloy which wet a precursor metallization on the cap and base wafer.

Figure 4A:
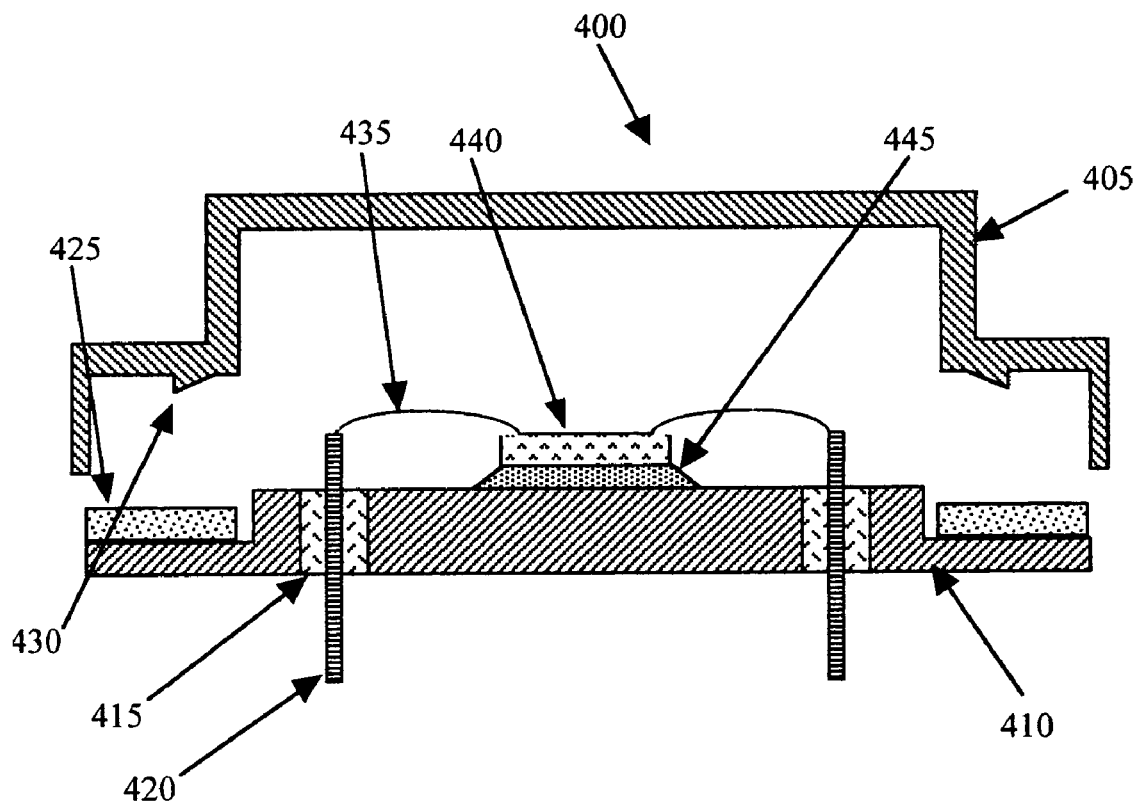
FIG. 4a shows the preferred structure of a package cap and base prior to compression bonding according to the disclosures of this invention.

The invention described herein utilizes an entirely different approach to hermetic package sealing. FIG. 4a shows in cross section a package cap 405 which may be circular or square from top view and similar to a conventional semiconductor package cap. A matching base 410 is shown below and in rough alignment with cap 405. Cap and base are prepared separately but are of the same metal material or if of different material the Thermal Coefficient of Expansion (TCE) must be nearly identical.

A preferred material for cap and base is a steel alloy Kovar. Stainless steels or other formable but refractory metals can be used. The cap is formed by stamping or machining. Stamping is preferred for low cost. Critical for the execution of the invention is the cutting edge 430 which runs circumferentially and continuously around the rim of the cap. A cutting edge formed on the cap is preferable. Alternatively the cutting edge may be formed on the base. The structure 430 is formed during the stamping or machining of the cap. The shape of the structure is nominally as shown and includes an outer vertical edge and a gently sloping surface toward the interior. The angle of the sloping side may be at a 10 to 30 degree acute angle from the flat surface it projects from. The height of the sharp cutting tip may be of the order of 100 to 500 µm from the flat surface. Variations from these dimensions will occur based on the cap material used. Base 410 is a conventional semiconductor type metal base with electrical feedthrus 420 and insulator 415 with MEMS die 440 connected to feedthrus 420 by bond wire 435. The peripheral area of the base is plated or clad with a copper layer 425 (preferred) which is sealed hermetically to the base 410. The copper layer need not be restricted as shown but may cover the entire metallic base. The thickness of the copper is approximately twice the thickness of cutting edge 430 height. Gasket 425 is composed of copper although it can be comprised of other materials that are deformable including but not limited to gold, indium and indium/tin/silver alloys, for example.

Figure 4B:
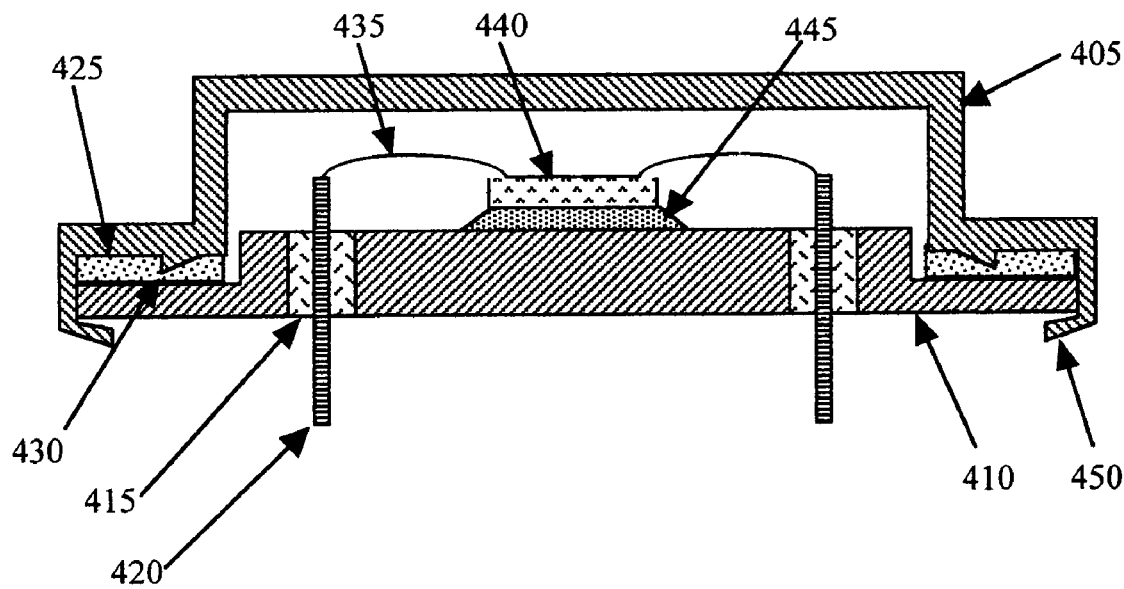
FIG. 4b shows the structure of the package cap and base after compression bond and sealing.

Continuing with FIG. 4b the cap is compression bonded to the base in a rarified gas or vacuum environment at room temperature using a high force compression bonder equipped with a compound die head. With copper as a gasket sealing material a force of from 30 to 100 lbs per mm of seal edge is required depending on the exact design of the cutting edge. Alignment of cap to base is achieved using an indexing X-Y stage to move the base under the cap. Sufficient force is applied between cap and base to bury the cutting edge 430 against the underside surface of the cap as shown in FIG. 4b. During compression softer gasket metal flows laterally along the sloping edge of the cutting structure 430 filling in any surface imperfections that can contribute to leakage paths through the vacuum seal created by structure 430. Simultaneously a movable section of the compound bonding die moves laterally inward on sections of the package periphery folding the lower edge of the cap extension in under the package base. The folded edge of the cap maintains the bonding force needed to keep cap 405 connected to base 410.

Figure 5A:
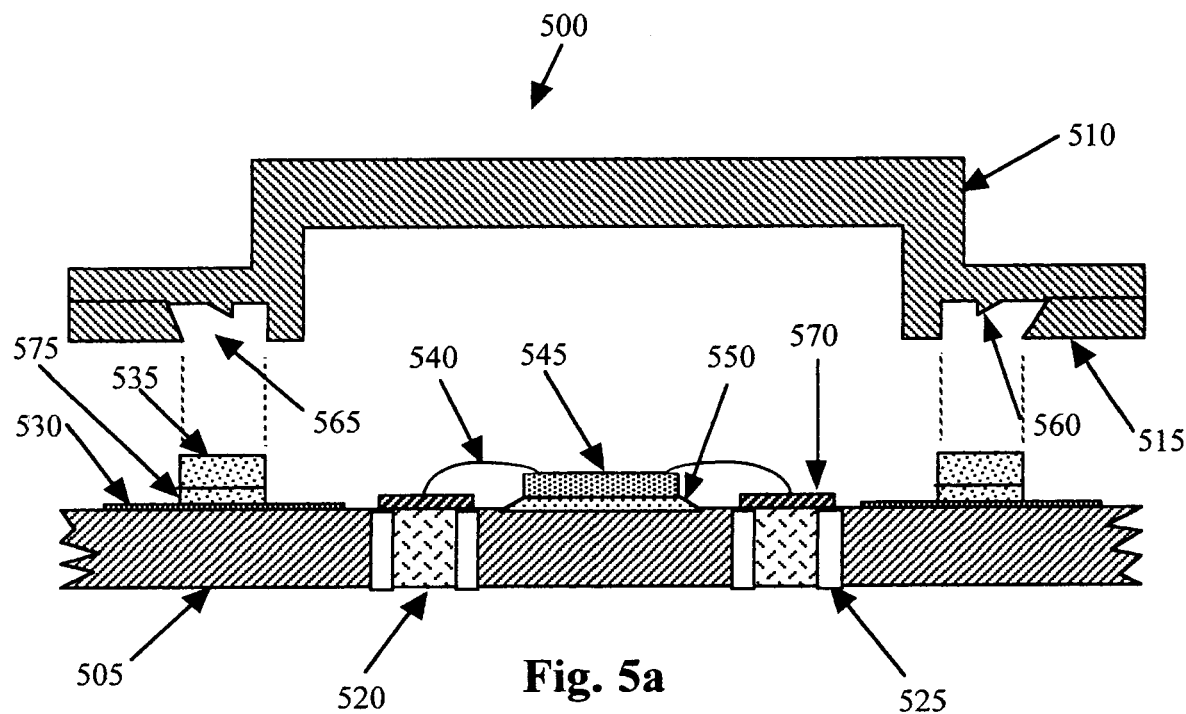
FIG. 5a shows a preferred structure for a package cap and package base structure where the package base consists of a plurality of un-singulated microdevices.

The compression bonding invention is extended to a wafer scale sealing application as exemplified in cross section of FIG. 5a and b. Assembly 500 in FIG. 5a represents a specialized package cap 510 with re-entrant cavity 565 formed via two stamping processes. Cap 510 is stamped from appropriate metal or other hermetic material typically in square shape while square, annular ring 515 is stamped separately from the same material that comprises cap 510. Cap 510 contains the cutting and sealing structure 560 stamped integrally with cap 510. Annular ring 515 is attached and aligned to cap 510 by solder, brazing, cladding or other means to form re-entrant cavity 565. Cap 510 may be disposed with a glass top surface window for optical microdevice applications. A single die section of substrate 505 is shown in FIG. 5a but it represents an extended portion of a substrate or wafer containing a large array of MEMS or microdevice die that have been fabricated integrally to substrate 505 or added by bonding as shown in the figure. Multiple sub die may be attached to within the single die site shown in the figure. Substrate 505 will typically contain hermetic electrical feedthrus 520 insulated as necessary from the conducting substrate by insulator 525. Wire bonds 540 connect die 545 to feedthrus 520. Die sites on substrate 505 are prepared for accepting caps 510 by applying a compressible metal ring 535 peripherally and continuously around each die site. In one preferred embodiment this is accomplished through conventional semiconductor copper bumping technology. During the fabrication process for the MEMS device at the wafer level and usually near the end of the process a robust adhesion layer 530 is applied typically by physical vapor deposition. Chromium or titanium/tungsten alloy adhesion layer is the preferred embodiment but other refractory materials may be used to induce compatibility with the rest of the MEMS fabrication steps. The adhesion layer is followed by the physical vapor deposition of a platable precursor material 575 of the same composition as annular ring 535. Both layers 530 and 575 cover the surface of the substrate and are unpatterned. A conventional photomasking step follows the layer 530 and 575 depositions and defines an opening in conventional resist layer that matches exactly the opening 565 in the cap 510. Electrical connection is made to the blanket films 530 and 575 and annular ring 535 is plated to the required thickness. The plated material will typically be copper, gold or indium, for example, depending on the degree of bonding force and mechanical integrity required. Finally the resist mask is removed and the thick annular plated ring is used as an etch mask to remove the thin deposited layers 530 and 575.

Figure 5B:
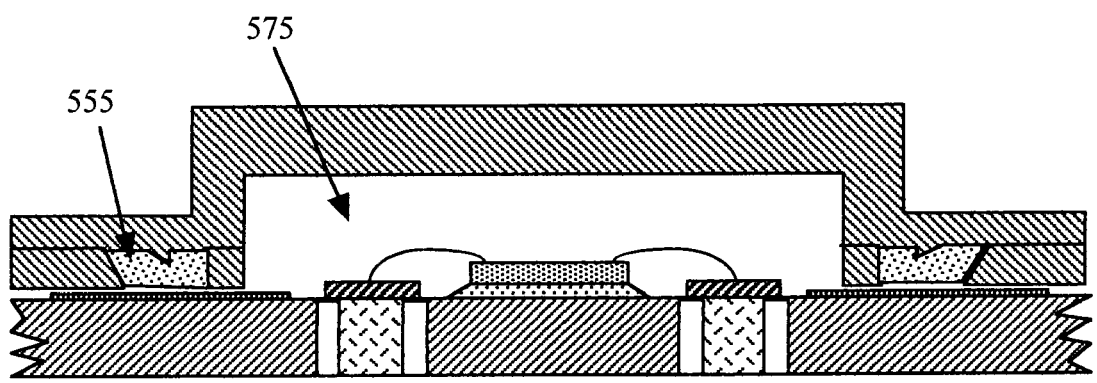
FIG. 5b shows the structure of a package cap and a wafer scale base consisting of a plurality of un-singulated microdevices after compression bond and sealing.
Figure 6:
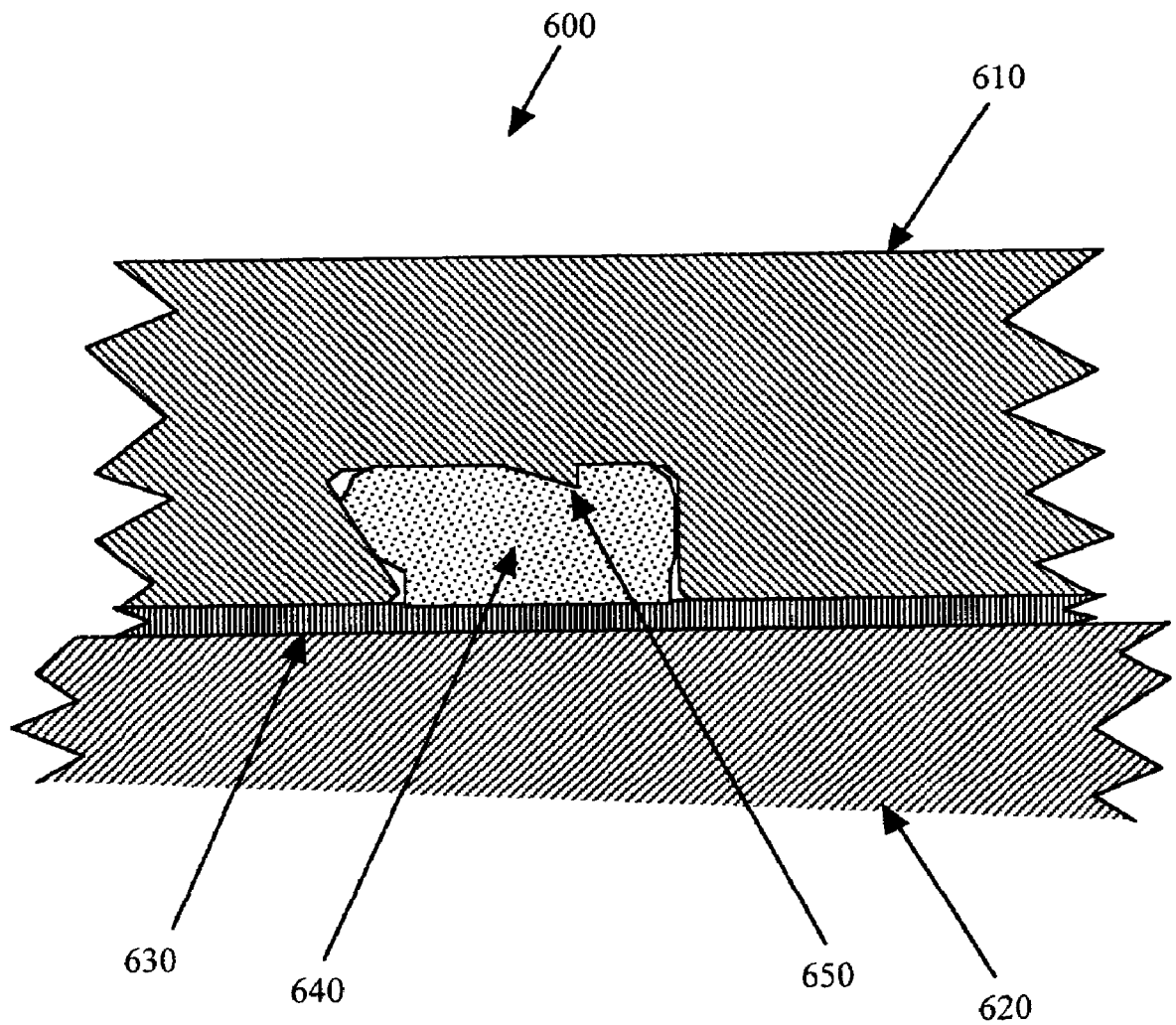
FIG. 6 shows detail of the knife edge sealing region preferred structure for the wafer scale sealing technology.

Refering again to FIG. 5a cap 510 and substrate or wafer has been prepared as described and shown in the drawing. MEMS devices on substrate 505 have been released and electrically probed for functionality. In a vacuum or rarified atmosphere and using appropriate alignment and compression bonding equipment caps 510 are bonded sequentially to all the die sites on substrate 505. FIG. 5b indicates the morphology of a compression bonded die site. Plated metal gasket 555 having been fabricated slightly thicker than the cavity 565 in FIG. 5a is compressed vertically while flowing horizontally to fill the re-entrant cavity 565 in FIG. 5a. Simultaneously cutting edge structure 560 of FIG. 5a forms a hermetic seal in the top of the plated annular ring 535 of FIG. 5a. The compressed annular ring structure 555 functions to maintain pressure on hermetic seal structure 560.

The present invention is well adapted to carry out the objects and attain the ends and advantages mentioned as well as other inherent therein. While a present embodiment of the invention has been described for the purpose of disclosure, numerous changes or alterations in the details of construction and steps of the method will be readily apparent to those skilled in the art. These are encompassed within the spirit and scope of the invention.

What is claimed is:

1. A method for hermetically sealing a MEMS or other type micro device in a single package, at room temperature, the method comprising the following:

providing a cover with an appropriate cutting structure for forming a hermetic seal and integral, deformable flange for the maintenance of force;

providing a package base with a peripheral surface containing a deformable, non-adhesive metal gasket of sufficient thickness to enable a hermetic seal when deformed by said cover cutting and flowing edge;

aligning the cover to the base and applying sufficient force between cover and base to effect a hermetic seal, at room temperature, by virtue of cutting and flowing said deformable metal gasket material on the package base while simultaneously deforming a metal flange for force maintenance means.

2. The method of claim 1 wherein the cutting edge sealing structure is formed on said cover by stamping, coining or machining means and is continuous around the periphery of the cover.

3. The method of claim 1 wherein the structure of said cutting edge of the deformable metal gasket material is such that a substantial flowing of the gasket material on the base occurs under bonding pressure.

4. The method of claim 1 wherein the package base contains a ring of said deformable gasket material that is hermetic to said package base and is comprised of a metallic material that is softer than cutting ring on the package cover.

5. The method of claim 1 wherein said force maintenance means between cover and base is provided through a metal forming and bending sequence that is concurrent with said hermetic sealing of said cover and base using said deformable metal gasket.

6. The method of claim 1 wherein force maintenance means between cover and base employs a permanent force of at least 30 lbs/mm of lineal circumferential seal.

7. The method of claim 1 wherein the composition of said deformable metal gasket material is copper, gold, aluminum, palladium, indium or silver.

* * * * *